United States Patent [19]
Müller

[11] Patent Number: 5,637,516
[45] Date of Patent: Jun. 10, 1997

[54] METHOD FOR PRODUCING MOS TRANSISTORS AND BIPOLAR TRANSISTORS ON THE SAME SEMICONDUCTOR WAFER

[75] Inventor: Karlheinz Müller, Waldkraiburg, Germany

[73] Assignee: Siemens Aktiengesellschaft, Munich, Germany

[21] Appl. No.: 501,358

[22] Filed: Jul. 12, 1995

[30] Foreign Application Priority Data

Jul. 12, 1994 [DE] Germany ............... 44 24 557.2

[51] Int. Cl.$^6$ ............................................. H01L 21/265
[52] U.S. Cl. ............................................. 438/203; 438/210
[58] Field of Search ............................ 437/34, 59, 162; 148/DIG. 9

[56] References Cited

U.S. PATENT DOCUMENTS

| | | |
|---|---|---|
| 4,735,911 | 4/1988 | Schaber. |
| 4,737,472 | 4/1988 | Schaber et al.. |
| 4,868,135 | 9/1989 | Ogura et al. ............ 437/34 |
| 4,970,174 | 11/1990 | Min et al. ............... 437/34 |
| 5,011,784 | 4/1991 | Ratnakumar ............ 437/34 |
| 5,026,654 | 6/1991 | Tanba et al.. |
| 5,192,992 | 3/1993 | Kim et al. ............... 437/34 |
| 5,196,356 | 3/1993 | Won et al. .............. 437/162 |
| 5,296,409 | 3/1994 | Merrill et al. ........... 437/34 |
| 5,319,234 | 6/1994 | Uga et al.. |
| 5,374,569 | 12/1994 | Yilmaz et al. ........... 437/34 |

FOREIGN PATENT DOCUMENTS

| | | |
|---|---|---|
| 0227970 | 7/1987 | European Pat. Off.. |
| 0232497 | 8/1987 | European Pat. Off.. |
| 0325181 | 7/1989 | European Pat. Off.. |
| 4230858 | 8/1993 | Germany. |

*Primary Examiner*—Tuan H. Nguyen
*Attorney, Agent, or Firm*—Herbert L. Lerner; Laurence A. Greenberg

[57] ABSTRACT

A method for producing complementary MOS and bipolar transistors on the same semiconductor wafer, includes producing buried zones of differing conductivity, producing n- and p-doped wells for corresponding transistors, and producing field oxide regions and insulated gate electrodes of the MOS transistors. After production of the field oxide regions, highly doped n-regions extending from a surface of the semiconductor wafer to a buried n-doped zone are produced with a first mask for producing a collector zone of an npn transistor and a base zone of a pnp transistor. After the production of the insulated gate electrodes, a first silicon layer is applied over the entire surface and doped with p-atoms. An auxiliary layer is applied on the first silicon layer over the entire surface. The auxiliary layer and the first silicon layer are structured with a second mask. A base contact zone of the npn transistor, source and drain zones of a p-MOS transistor, and a collector zone and an emitter zone of the pnp transistor are simultaneously produced, by diffusion out from the structured first silicon layer. The first silicon layer is laterally insulated, and a second silicon layer is produced, doped with n-atoms, and structured with a mask. An emitter zone and a collector terminal zone of the npn transistor, a base terminal of the pnp transistor, and source and drain zones of an n-MOS transistor are simultaneously produced by diffusion out from the structured second silicon layer.

7 Claims, 6 Drawing Sheets

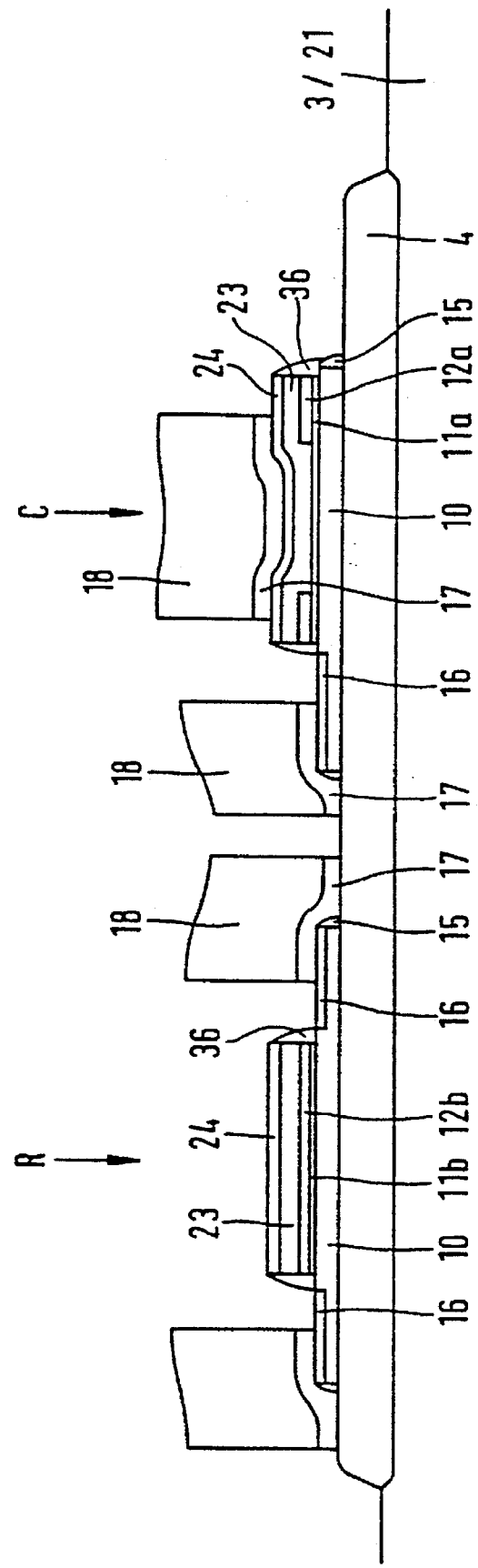

1

METHOD FOR PRODUCING MOS TRANSISTORS AND BIPOLAR TRANSISTORS ON THE SAME SEMICONDUCTOR WAFER

BACKGROUND OF THE INVENTION

Field of the Invention

The invention relates to a method for producing complementary MOS transistors and complementary bipolar transistors on the same semiconductor wafer, which includes producing buried zones of differing conductivity, producing n-doped and p-doped wells for corresponding transistors, and producing field oxide regions and insulated gate electrodes of the MOS transistors.

One such method is known, for instance, from European Patent Application 0 227 690 A. The production of devices with bipolar and MOS transistors is typically expensive and complicated, since transistors for analog signal processing, in particular, must have different properties from transistors for digital signal processing. The active regions of the bipolar and MOS transistors are therefore produced with a number of masks, in accordance with the properties to be attained. Further masks are needed if a resistor or a capacitor is to be integrated in addition. The connection of the active transistor regions to the associated metallizing lines must be provided in such a way that a reliable, low-impedance connection is produced.

SUMMARY OF THE INVENTION

It is accordingly an object of the invention to provide a method for producing MOS transistors and bipolar transistors on the same semiconductor wafer, which overcomes the hereinafore-mentioned disadvantages of the heretofore-known methods of this general type and which improves the production process for a device that has MOS and bipolar transistors.

With the foregoing and other objects in view there is provided, in accordance with the invention, in a method for producing complementary MOS transistors and complementary bipolar transistors on the same semiconductor wafer, which includes producing buried zones of differing conductivity, producing n-doped and p-doped wells for corresponding transistors, and producing field oxide regions and insulated gate electrodes of the MOS transistors, the improvement which comprises after the production of the field oxide regions, producing highly doped n-regions extending from a surface of the semiconductor wafer and reaching to a given buried n-doped zone with a first mask for producing a collector zone of an npn transistor and a base zone of a pnp transistor; after the production of the insulated gate electrodes, applying a first silicon layer over the entire surface and doping the first silicon layer with p-atoms; applying an auxiliary layer on the first silicon layer over the entire surface; structuring the auxiliary layer and the first silicon layer with a second mask; simultaneously producing a base contact zone of the npn transistor, source and drain zones of a p-MOS transistor, and a collector zone and an emitter zone of the pnp transistor, by diffusion out from the structured first silicon layer; laterally insulating the first silicon layer, and producing, doping with n-atoms, and structuring a second silicon layer with a mask; and simultaneously producing an emitter zone and a collector terminal zone of the npn transistor, a base terminal of the pnp transistor, and source and drain zones of an n-MOS transistor, by diffusion out from the structured second silicon layer.

The advantage of the invention is that after a channel implantation for the MOS transistors, a silicon layer can be deposited over the entire surface and doped, and that after that, with a single structuring mask, the p+ source and drain zones, the base contact of a bipolar npn transistor, the collector and emitter of a pnp transistor, and optionally elements for passive components, can all be produced simultaneously. With a further silicon layer with different doping, the n+ source and drain zones, the emitter and collector terminals of an npn bipolar transistor, the base of a pnp transistor, and optionally further elements for passive components, can be produced simultaneously with a single additional mask. In accordance with other method steps, it is possible for all of the regions of the silicon layer regions intended for contacting to be insulated from one another and exposed, so that siliconizing can be carried out thereafter. A metallizing layer, for instance of aluminum, can then be applied over the silicide regions. This produces low-impedance, reliable active and passive component connections.

In accordance with another mode of the invention, there is provided a method which comprises applying an amorphous silicon layer as the first silicon layer, and recrystallizing the amorphous silicon layer after the doping with p-atoms.

In accordance with a further mode of the invention, there is provided a method which comprises doping over the entire surface with p-atoms, after the structuring of the first silicon layer, to produce a base zone for the npn transistor.

In accordance with an added mode of the invention, there is provided a method which comprises low doping the zones of the semiconductor wafer intended for the source and drain regions of the MOS transistors, before the first silicon layer is applied.

In accordance with an additional mode of the invention, there is provided a method which comprises doping the first silicon layer in nonmasked regions, correspondingly doping the masked regions with a second p-conductive material with a lower doping than is intended for the nonmasked regions, in a preceding step, and exposing the masked regions after the doping of the nonmasked regions of the first silicon layer.

In accordance with yet another mode of the invention, there is provided a method which comprises during the structuring of the first silicon layer, forming a first capacitance electrode; placing lateral insulation ribs on the first silicon layer after its structuring; forming a further structuring mask on the first capacitance electrode for further structuring of the auxiliary layer; partially removing the auxiliary layer; and applying, doping, and structuring the second silicon layer to form a second capacitance electrode, after the removal of the further structuring mask.

In accordance with a concomitant mode of the invention, there is provided a method which comprises insulating the first and second silicon layers from one another and from the gate electrodes of the MOS transistors, and exposing and siliconizing surfaces in the first and second silicon layers.

Other features which are considered as characteristic for the invention are set forth in the appended claims.

Although the invention is illustrated and described herein as embodied in a method for producing MOS transistors and bipolar transistors on the same semiconductor wafer, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 8 is a cross-sectional view of a semiconductor wafer having a resistor and a capacitor.

DESCRIPTION OF THE PREFERRED EMBODIMENTS

Figure 6:
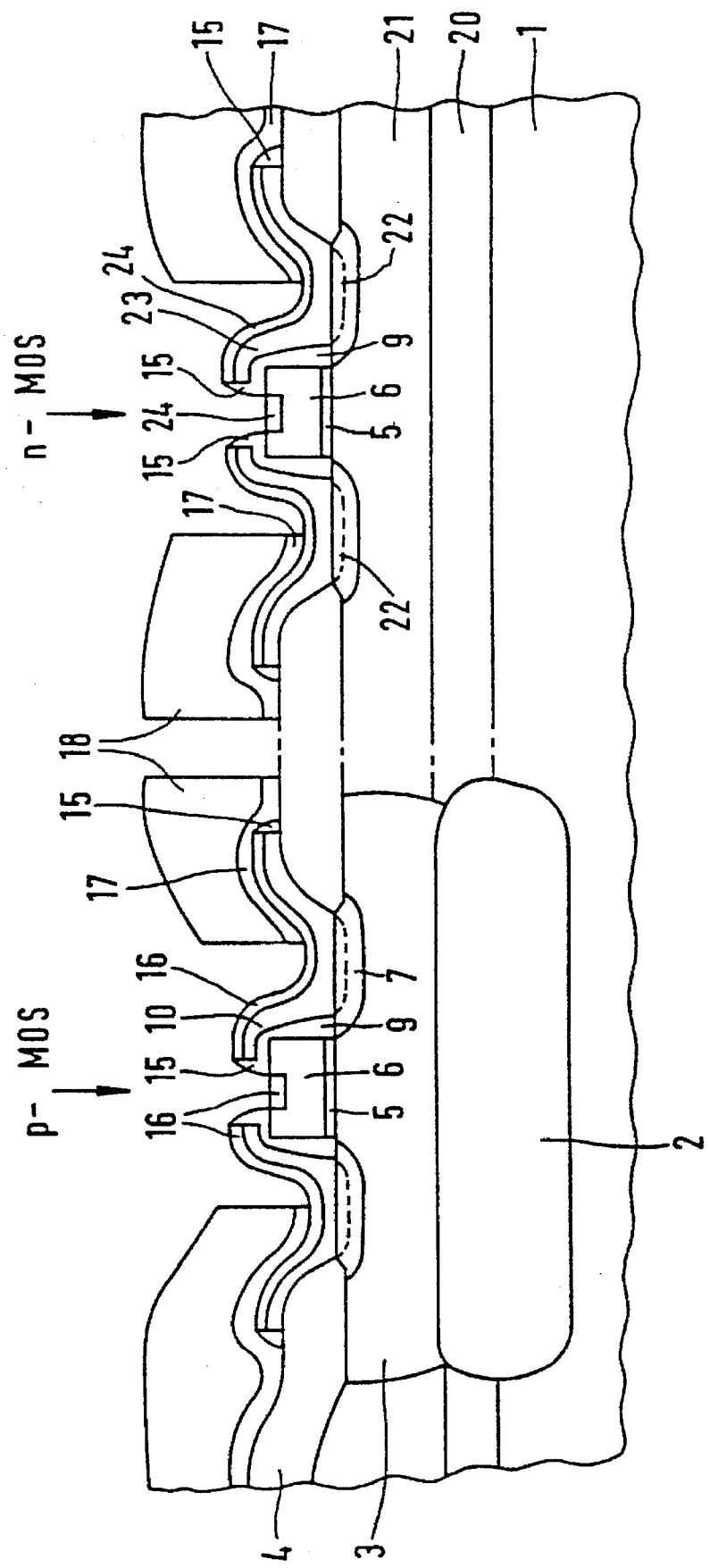
FIG. 6 is a fragmentary, cross-sectional view of a semiconductor wafer for both a p-channel and an n-channel MOS transistor.
Figure 7:
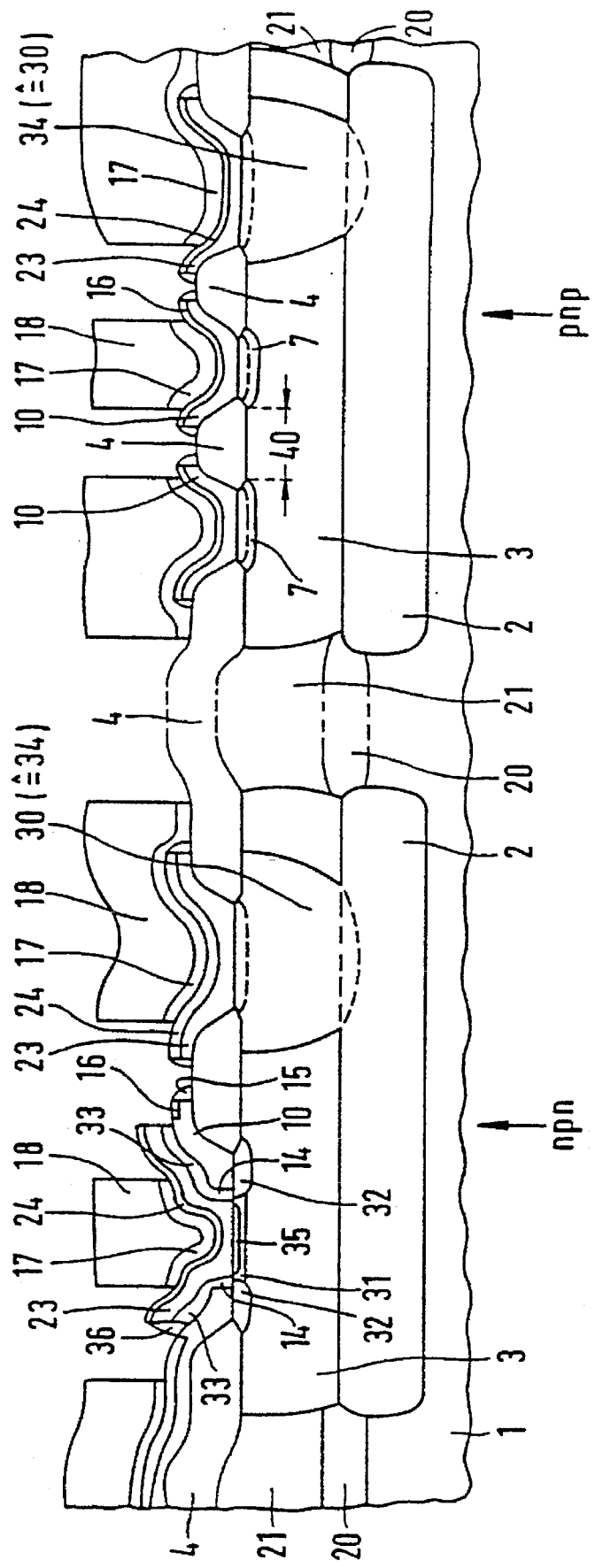
FIG. 7 is a fragmentary, cross-sectional view of a semiconductor wafer having an npn and pnp transistor.

Referring now to the figures of the drawing in detail and first, particularly, to FIGS. 1 and 6–8 thereof, it is seen that an n+-doped buried layer 2 is first made on a p-doped substrate 1, and then a p+-doped buried layer 20, shown in FIGS. 6 and 7, follows the layer 2. Next, an epitaxial layer is applied over the entire surface, and in it n-wells 3 and p-wells 21 shown in FIGS. 6 and 7 are made. It is possible to produce differently doped n-wells for the bipolar transistors with analog properties to be made on one hand, and for the MOS transistor and bipolar transistors with digital properties on the other hand. Next, field oxide regions 4 are made by local oxidation, for insulating the active elements that are to be produced. Masking follows, with ensuing n+-implantation, for producing a highly conductive region between the surface of the semiconductor wafer and the buried zone 2. The result is the making of a collector zone 30 in a vertical npn transistor and a base zone 34 seen in FIG. 7 in a lateral pnp transistor.

Once the photoresist mask is stripped and a curing process has taken place, implantation with p-doping takes place over the entire surface. Next follows a photo-technique or masking, and using the mask (threshold mask), doping is performed in order to adjust threshold voltages of the MOS transistors. Next is an application of a gate insulation layer, a polycrystalline layer over it which is doped or becomes doped, and an insulation layer resting over that, for instance a TEOS layer applied by an LPCVD process (low-pressure chemical vapor deposition). This TEOS layer serves to insulate the polysilicon layer beneath it from further polysilicon layers to be applied in ensuing method steps. Next, structuring of the top insulation layer and of the polysilicon layer is performed with a photo-technique, in order to produce gates of the MOS transistors.

With a further photo-technique and ensuing implantation with an n-conductive material, such as phosphorus, LDD regions (lightly doped drain regions) of the n-channel transistors are produced by overcompensation of the full-surface p-doping carried out beforehand (prior to the threshold mask). After an application of an insulating layer, for example LPCVD-TEOS, back-etching follows, in order to form lateral insulation ribs (spacers). This produces the structure shown in FIG. 1, in which the n-well 3 contains LOCOS regions 4, between which the gate insulation 5 and the gate 6 as well as an insulation layer 8 placed over them are disposed. At the sides, the gate is insulated by spacers 9, so that the gate is surrounded on all sides by an insulating layer. LDD regions 7 are disposed between the gate 6 and the LOCOS regions 4. In a p-channel transistor, the LDD regions 7 are p-doped, while in an n-channel transistor they are n-doped. In configurations lacking LDD regions, the lateral insulation ribs are produced immediately after the structuring of the gate.

Figure 1:
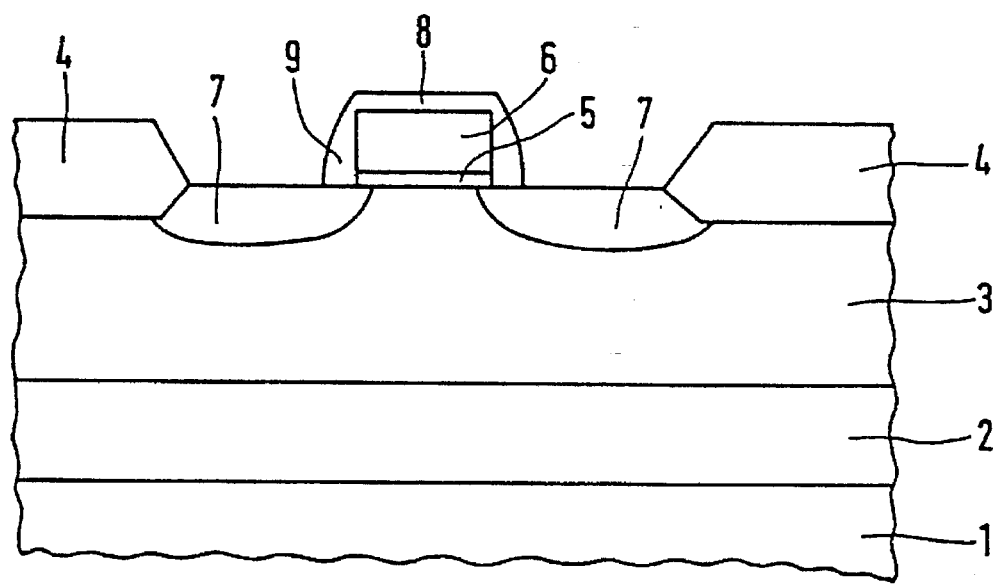
FIGS. 1–5 are fragmentary, diagrammatic, cross-sectional views of a semiconductor wafer with a p-channel MOS transistor to be produced.
Figure 2:
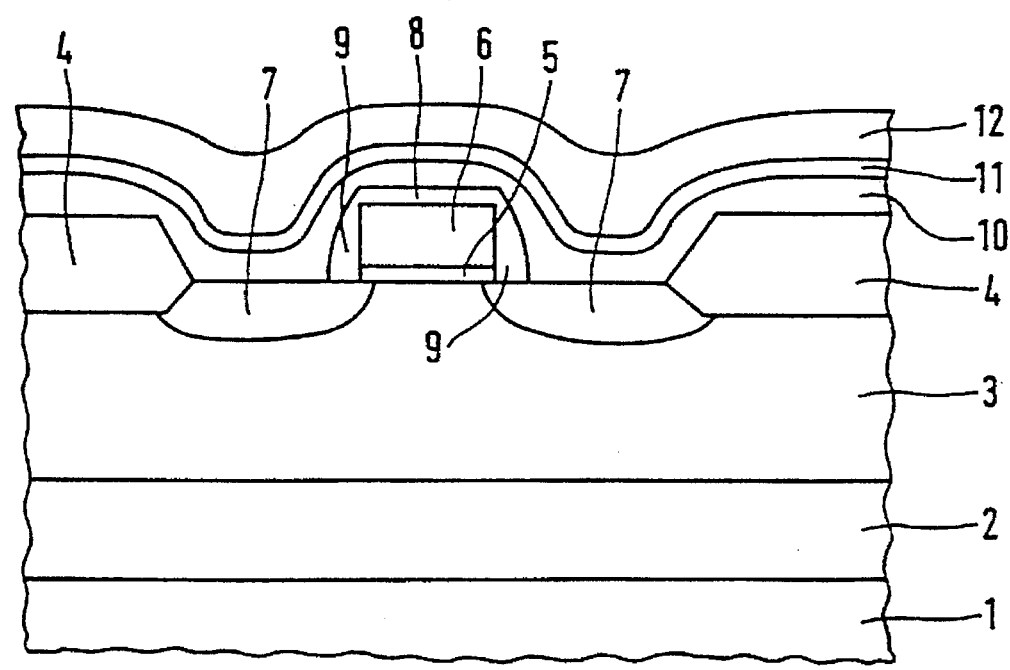

Next, a first silicon layer 10 which, for instance, is formed of polysilicon or amorphous silicon and is 200 nm thick is deposited over the entire surface and is highly doped with p-atoms, as is seen in FIG. 2. In the case of the amorphous silicon layer, recrystallization follows. This is followed by a lining with oxide at a temperature of 700° to 800° C. The oxide is then etched, and a nitride coating 11 is made with a thickness of 20 to 50 nm. (In regions in which a capacitor is to be made, this nitride coating 11 over the then-crystalline polysilicon layer 10 can then form the dielectric.) Subsequently, an insulating layer, for instance a TEOS layer 12, is applied by low pressure deposition from the gas phase (LPCVD). The nitride layer 11 and the oxide layer 12 form an auxiliary layer. Curing of the configuration follows at approximately 800° C.

It should be added that after deposition of the first silicon layer 10, one option that is possible for producing a high-impedance resistor is that in which the silicon layer is first low-p-doped over the entire surface, for instance with boron, and after that a photo-technique is performed with ensuing high-doped p-implantation of the non-high-impedance resistor regions, as well as stripping of the photoresist mask.

Figure 3:
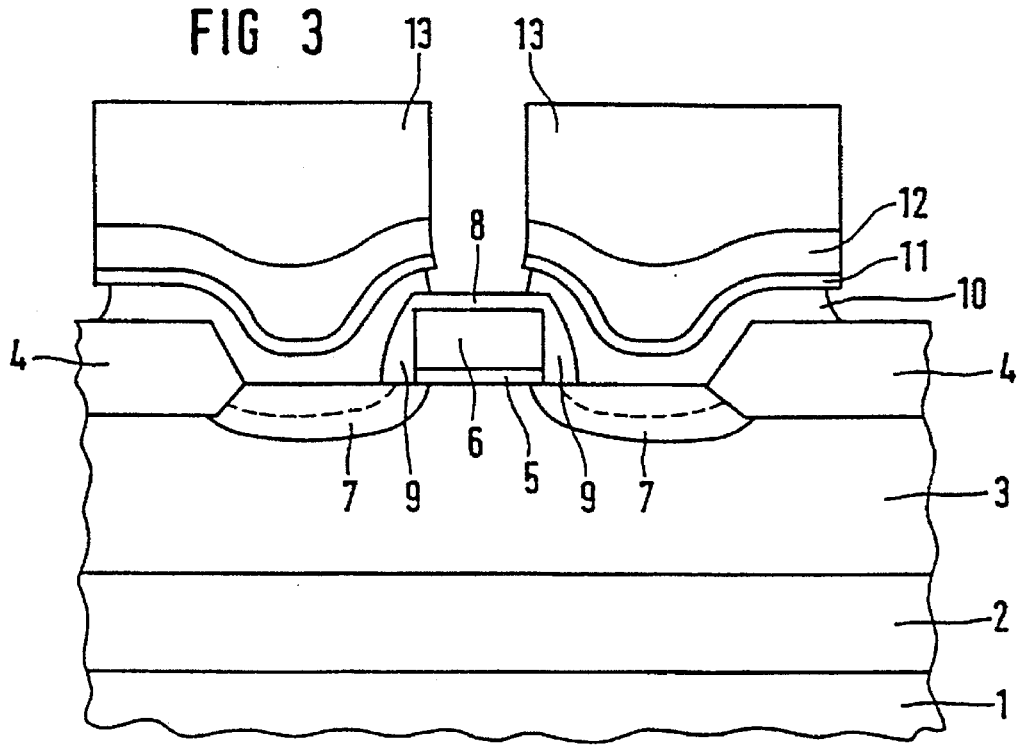

A single further photo-technique prepares for the production of the base zone for the bipolar npn transistor, the p+-source/drain contact regions of the p-channel MOS transistor, the collector and emitter zones of the pnp transistor, and optionally a high-impedance resistor R and an electrode of a capacitor C seen in FIG. 8. In FIG. 3, after a structuring of a mask 13, the oxide layer 12 and the nitride layer 11 under it are etched. This is followed by etching of the first silicon layer 10. One advantage of the method is that the MOS production process is not separate from the process of producing the bipolar transistors. On the contrary, process steps are used for the simultaneous production of elements of the bipolar and the unipolar transistors. The method therefore makes do with a maximum of ten masks to produce a structure as shown in FIG. 3.

The elements being made with the various masks are as follows: with the first mask, the n+-buried zone 2; with the second and third masks, the n-wells for the CMOS and the bipolar digital transistors and the bipolar analog transistor; with the fourth mask, the field oxide regions by local oxidation; with the fifth mask, the collector and base depth terminal for the npn and pnp transistors, respectively; with the sixth mask, the threshold voltages; with the seventh mask, the gates of the MOS transistors; with the eighth mask, the LDD regions of the n-channel MOS transistors; with the ninth mask, selectively, the high-impedance resistor; and finally, with the tenth mask, the following above-described elements: the base contact for the npn transistor, the source/drain regions for the p-channel MOS transistor, the emitter/collector zones for the pnp transistor, and the elements of the resistor and the capacitor.

Figure 4:
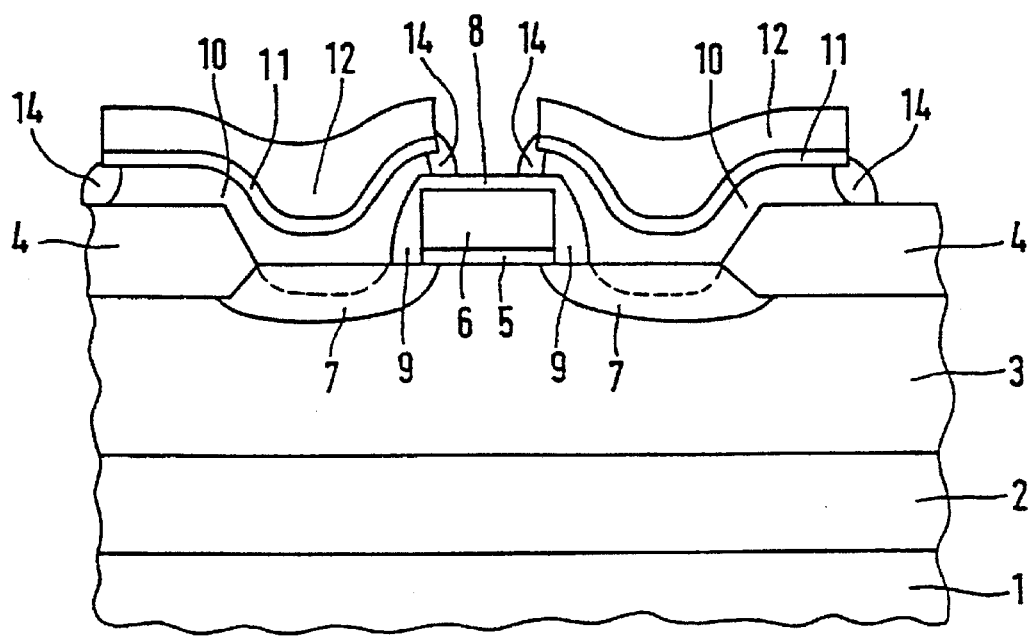
Figure 5:
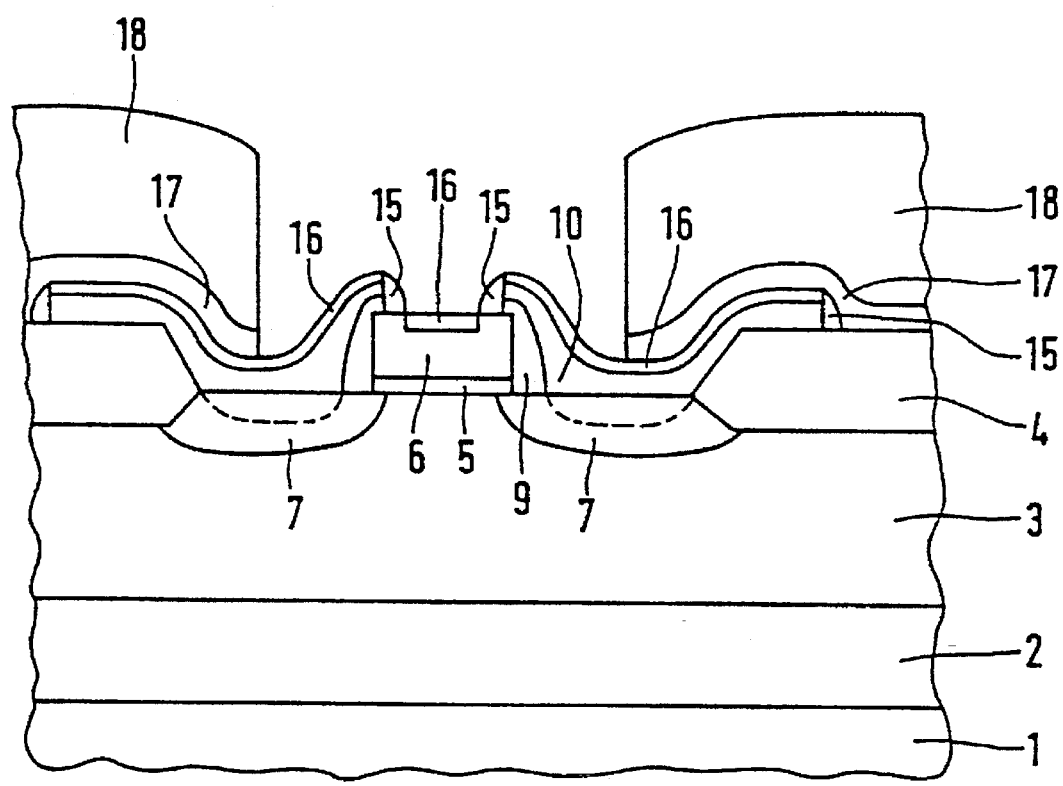

Etching of the silicon layer 10 is followed by a lining with a stray oxide and a full-surface implantation of p-atoms, such as boron, to produce a base zone 31. A base contact zone 32 of the npn transistor, the source/drain zones for the PMOS transistor, and the collector and emitter zones for the pnp transistor are produced by diffusing out from the structured and doped layer 10. Subsequently, an insulation layer 33, for example of LPCVD-TEOS, is applied and back-etched, in order to insulate the structured silicon regions 10, both on their surface (layer 33) and laterally, with lateral insulation ribs (14), as is seen in FIG. 4 and in FIG. 7 for the npn transistor.

If the option for producing a capacitance is to be employed, in which the nitride layer 11 is to form the dielectric, then as is shown in FIG. 8, the oxide layer 12 is structured in the region of the capacitor with the aid of a photo-technique in such a way as to produce a structured oxide region 12a, above a dielectric region 11a made from the nitride layer 11. The lacquer mask is then stripped. In the case of the resistor R as the other passive component, the nitride and oxide layers (11 and 12) are structured in the manner described above and are designated as layers 11b and 12b, respectively. In the resistor R, it is possible for the nitride layer 11b to be omitted and for only the oxide layer 12b to be provided.

In the next step, a crystalline polysilicon layer 23 is produced and implanted over the entire surface with an n-conductive material, such as arsenic. This is followed by structuring of the polysilicon layer 23, using a photo-technique, in order to use a diffusion step to produce contact zones 35 for the emitter terminal and the collector terminal of the npn bipolar transistor, for the base terminal of the pnp transistor seen in FIG. 7, for n+-doped source/drain zones 22 of the n-channel MOS transistor seen in FIG. 6, for a second electrode of the capacitance C, and optionally for covering the insulation layer 12b of the resistor R seen in FIG. 8. Next, the photoresist is stripped. Once again, the described process steps are carried out simultaneously for both the bipolar and the MOS transistors.

As an option, the production of a contact hole can then follow. In order to accomplish that, an insulation layer, for instance of LPCVD-TEOS, and a boron-phosphorus-silicate glass layer (BPSG) placed over it, are first applied. A reflow step follows, followed by a photo-technique for the contact hole with ensuing contact hole etching with an anisotropic etchant. After stripping of the photoresist and optionally post treatment in a gas atmosphere, the contact holes to the structured polysilicon layers 10 and 23 are made. The contact holes can also be provided for a planned multilayer wiring for the configuration.

The method steps described thus far produce all of the contact terminals for the active regions of the transistors and for the terminals of the passive components. The terminals themselves are pulled out of the respective well, and the contact to the active regions in the monosilicon of the wells is performed by diffusing out from the respective polysilicon layer into the active region, that is for MOS transistors, into the LDD regions 7 and 22. In FIG. 6, the highly doped regions of the p-zones 7 and n-zones 22 produced by the diffusion are shown in dashed lines.

Through the use of the joint production of the npn emitter terminal, the pnp base terminal, and the n+-doped source/drain zones of the n-channel transistor (regions 22), one less mask is needed as compared with previous production technologies having separate production steps for the bipolar transistor and the MOS transistor, so that a single mask suffices for those contact terminals.

According to a feature of the invention, the production of the structured regions 23 is followed by the production of a metallizing layer. To that end, the invention provides that the silicon regions 10 and 23 first be insulated laterally. To that end, an insulating layer, for example of LPCVD-TEOS, is applied, cured by rapid optical annealing (ROA), and back-etched in such a way that lateral insulation ribs or spacers 15 and 36 are formed on the side regions of the silicon layers 10 and 23, respectively, and otherwise these silicon layers 10 and 23 are exposed at their surface. This is true both for the transistors and for the passive components R and C. It is equally true for the gate regions of the MOS transistors, which leave a window open all the way into the polysilicon region 6 through the use of the spacers 15. Next, the silicon regions, which are exposed or laid bare at their surface, are siliconized using platinum, titanium or tantalum, so that the silicon layers 6, 10 and 23 are provided with silicide regions 16 and 24. The silicon layer 23, which is provided alternatively on the resistor 4 and which has its silicide 24, is practical in order to define and fix the high-impedance region through the use of self-adjusted production of the siliconized terminal regions 16.

Advantages of the invention include the fact that active regions are produced by diffusion out from doped and structured silicon layers simultaneously for bipolar and MOS transistors, and that siliconizing is provided not in the monosilicon but only on polysilicon layers, so that the difficulties involved in siliconizing monosilicon do not arise. Another advantage is that because of the course of the process and the structure of the configuration, it is possible to dispense with a contact hole photo-technique (etching process). The siliconized polysilicon layers lower the resistance per unit of surface area by a multiple factor (from approximately 200 Ohm/· to approximately 5 Ohm/·.). In the production process, the stripping of the non-siliconized metal ensues. Next, a titanium, titanium nitride or titanium tungsten layer is applied as a barrier layer 17, and a metallizing layer 18, for instance of AlSiCu, is applied over that. These last two applied layers are etched with the aid of a further photo-technique and a non-illustrated structured photoresist mask, so that a structured metallizing 17, 18 is the result. Next, the photoresist is stripped, and the method for producing the integrated circuit is continued with the usual steps, which are not described in detail herein.

I claim:

1. In a method for producing complementary MOS transistors and complementary bipolar transistors on the same semiconductor wafer, which includes producing buried zones of differing conductivity, producing n-doped and p-doped wells for corresponding transistors, and producing field oxide regions and insulated gate electrodes of the MOS transistors, the improvement which comprises:

after the production of the field oxide regions, producing highly doped n-regions extending from a surface of the semiconductor wafer and reaching to a given buried n-doped zone with a first mask for producing a collector zone of an npn transistor and a base zone of a pnp transistor;

after the production of the insulated gate electrodes, applying a first silicon layer over the entire surface and doping the first silicon layer with p-atoms;

applying an auxiliary layer on the first silicon layer over the entire surface;

structuring the auxiliary layer and the first silicon layer with a second mask;

simultaneously producing a base contact zone of the npn transistor, source and drain zones of a p-MOS transistor, and a collector zone and an emitter zone of the pnp transistor, by diffusion out from the structured first silicon layer;

laterally insulating the first silicon layer, and producing, doping with n-atoms, and structuring a second silicon layer with a mask; and simultaneously producing an emitter zone and a collector terminal zone of the npn transistor, a base terminal of the pnp transistor, and source and drain zones of an n-MOS transistor, by diffusion out from the structured second silicon layer.

2. The method according to claim 1, which comprises applying an amorphous silicon layer as the first silicon layer, and recrystallizing the amorphous silicon layer after the doping with p-atoms.

3. The method according to claim 1, which comprises doping over the entire surface with p-atoms, after the structuring of the first silicon layer, to produce a base zone for the npn transistor.

4. The method according to claim 1, which comprises low doping the zones of the semiconductor wafer intended for the source and drain regions of the MOS transistors, before the first silicon layer is applied.

5. The method according to claim 1, which comprises doping the first silicon layer in nonmasked regions, correspondingly doping the masked regions with a second p-conductive material with a lower doping than is intended for the nonmasked regions, in a preceding step, and exposing the masked regions after the doping of the nonmasked regions of the first silicon layer.

6. The method according to claim 1, which comprises during the structuring of the first silicon layer, forming a first capacitance electrode; placing lateral insulation ribs on the first silicon layer after its structuring; forming a further structuring mask on the first capacitance electrode for further structuring of the auxiliary layer; partially removing the auxiliary layer; and applying, doping, and structuring the second silicon layer to form a second capacitance electrode, after the removal of the further structuring mask.

7. The method according to claim 1, which comprises insulating the first and second silicon layers from one another and from the gate electrodes of the MOS transistors, and exposing and siliconizing surfaces in the first and second silicon layers.

* * * * *